(12) United States Patent
Kim et al.

(10) Patent No.: US 9,153,632 B2
(45) Date of Patent: Oct. 6, 2015

(54) ORGANIC LIGHT EMITTING DEVICE DISPLAY AND MANUFACTURING METHOD THEREOF

(71) Applicant: Samsung Display Co., Ltd., Yongin, Gyeonggi-Do (KR)

(72) Inventors: Na-Young Kim, Yongin (KR); Ki-Nyeng Kang, Yongin (KR); Keum-Nam Kim, Yongin (KR)

(73) Assignee: SAMSUNG DISPLAY CO., LTD., Yongin-Si (KR)

( * ) Notice: Subject to any disclaimer, the term of this patent is extended or adjusted under 35 U.S.C. 154(b) by 30 days.

(21) Appl. No.: 13/960,672

(22) Filed: Aug. 6, 2013

(65) Prior Publication Data
US 2014/0291624 A1   Oct. 2, 2014

(30) Foreign Application Priority Data
Mar. 27, 2013   (KR) .................... 10-2013-0033079

(51) Int. Cl.
*H01L 27/32*   (2006.01)
*H01L 51/56*   (2006.01)
*H01L 27/12*   (2006.01)

(52) U.S. Cl.
CPC .......... *H01L 27/3248* (2013.01); *H01L 27/124* (2013.01); *H01L 27/1259* (2013.01); *H01L 2251/568* (2013.01)

(58) Field of Classification Search
CPC ................ H01L 2251/568; H01L 27/3248
See application file for complete search history.

(56) References Cited

U.S. PATENT DOCUMENTS

| | | |
|---|---|---|
| 5,824,564 A | 10/1998 | Watanabe |
| 8,258,692 B2 | 9/2012 | Hong et al. |
| 2005/0116631 A1* | 6/2005 | Kim et al. ..................... 313/506 |
| 2005/0173707 A1* | 8/2005 | Shiraki et al. .................. 257/72 |
| 2005/0174500 A1* | 8/2005 | Shiraki et al. .................. 349/42 |
| 2005/0269962 A1* | 12/2005 | Matsunaga ............... 315/169.3 |
| 2007/0120476 A1* | 5/2007 | Park et al. .................... 313/506 |
| 2012/0026144 A1 | 2/2012 | Kang et al. |
| 2012/0064641 A1* | 3/2012 | Yang et al. ....................... 438/4 |
| 2012/0127217 A1* | 5/2012 | Tamaki et al. ............... 345/690 |
| 2013/0234143 A1* | 9/2013 | Hwang et al. .................. 257/57 |
| 2013/0235292 A1* | 9/2013 | Hara et al. ...................... 349/41 |
| 2013/0240914 A1* | 9/2013 | Jin et al. ......................... 257/88 |

FOREIGN PATENT DOCUMENTS

| | | |
|---|---|---|
| JP | 9-230382 A | 9/1997 |
| JP | 2002-341379 A | 11/2002 |
| KR | 10-2007-0043550 A | 4/2007 |
| KR | 10-0932989 B1 | 12/2009 |
| KR | 2012-0010824 A | 2/2012 |

* cited by examiner

*Primary Examiner* — Michael Lebentritt
*Assistant Examiner* — Jordan Klein
(74) *Attorney, Agent, or Firm* — Knobbe Martens Olson & Bear, LLP

(57) ABSTRACT

Provided is an organic light emitting display including a pixel circuit unit prepared over a substrate and comprising a plurality of thin film transistors (TFTs), and an organic light emitting device or diode (OLED) electrically connected to the pixel circuit unit. The pixel circuit unit and the OLED are connected through a repair unit comprising a semiconductor material, in order to facilitate easy repair.

11 Claims, 6 Drawing Sheets

ORGANIC LIGHT EMITTING DEVICE DISPLAY AND MANUFACTURING METHOD THEREOF

CROSS-REFERENCE TO RELATED PATENT APPLICATION

This application claims the benefit of Korean Patent Application No. 10-2013-0033079, filed on Mar. 27, 2013, in the Korean Intellectual Property Office, the disclosure of which is incorporated herein in its entirety by reference.

BACKGROUND

1. Field

The present disclosure relates to an organic light emitting device display and a manufacturing method thereof.

2. Discussion of the Related Technology

A flat panel display such as an organic light emitting display or a liquid crystal display (LCD) includes a plurality of pixels. Each pixel includes a pixel circuit unit including a thin film transistor (TFT) and a capacitor, and each pixel circuit unit is connected to an organic light emitting device or diode (OLED).

As the resolution of a flat panel display becomes higher, the number of pixels becomes larger and their integrity is enhanced. Also, as the size of a flat panel display becomes larger, defective pixels are more likely to occur. In particular, for a large-sized flat panel display, since the number of panels formed on a mother substrate becomes smaller, the production yield of a flat panel display is significantly affected because the entire mother substrate including a defective panel needs to be discarded. Accordingly, a repairable pixel structure and a method of repairing the same, which are suitable for a high resolution and large-sized flat panel display, are required.

SUMMARY

The present invention provides an organic light emitting device (OLED) display, which is easily repairable, and a manufacturing method thereof.

One aspect of the present invention provides an organic light emitting device (OLED) display including: a pixel circuit unit prepared over a substrate and comprising a plurality of thin film transistors (TFTs); and an OLED electrically connected to the pixel circuit unit, wherein the pixel circuit unit and the OLED are connected through a repair unit comprising a first portion of a semiconductor material.

The plurality of TFTs includes a first TFT, and the first TFT may include: a first activation layer comprising the semiconductor material, and further comprising a source region, a channel region, and a drain region, the first activation layer being integrated with the repair unit; and a first gate electrode insulated from the first activation layer by a first insulating layer and disposed corresponding to the channel region.

The pixel circuit unit may include a second TFT connected to the first TFT, wherein the second TFT may include: a second activation layer comprising the semiconductor material; and a second gate electrode insulated from the second activation layer by the first insulating layer.

The OLED may include: a bottom electrode disposed over the first insulating layer; an intermediate layer formed over the bottom electrode; and a top electrode formed over the intermediate layer to face the bottom electrode.

The OLED display may further include a second insulating layer covering the first gate electrode and the second gate electrode; and a contact unit disposed over the second insulating unit, having one end connected to the repair unit through a hole formed through the first insulation layer and the second insulation layer, and having another end that is connected to the bottom electrode.

A thickness of the repair unit may be smaller than a thickness of the contact unit.

The first insulating layer, the second insulating layer, and a third insulating layer may be sequentially disposed over the repair unit, and the top electrode is disposed over the third insulating layer.

The OLED display may further include a flattening layer covering the pixel circuit unit, wherein the OLED may include: a bottom electrode disposed over the flattening layer; an intermediate layer formed over the bottom electrode; and a top electrode formed over the intermediate layer to face the bottom electrode.

The first insulating layer, the second insulating layer, the flattening layer, and a third insulating layer may be sequentially disposed over the repair unit, and the top electrode is disposed over the third insulating layer.

The repair unit may be formed of a polysilicon.

Another aspect of the present invention provides a method of manufacturing an OLED display, the method including: forming a first activation layer, a second activation layer, and a repair unit over a substrate, wherein the first activation layer and the repair unit are integrated; forming a first gate electrode and a second gate electrode over a first insulating layer formed over the first activation layer, the second activation layer, and the repair unit, and forming a bottom electrode over the first insulating layer; forming a contact unit connected to the repair unit and the bottom electrode over a second insulating layer formed over the first gate electrode and the second gate electrode; forming an opening in a third insulating layer formed over the contact unit to expose the bottom electrode; forming an intermediate layer and a top electrode over the exposed bottom layer to form a pixel; determining whether the pixel has a white spot defect; and when determined that the pixel has a white spot defect, applying a laser beam onto the repair unit of the pixel which has the white spot defect.

The first activation layer, the second activation layer and the repair unit may include a polysilicon.

The applying of the laser beam may cause cutting the repair unit to change the pixel to a dark spot.

The applying of the laser beam may include emitting the laser beam toward the substrate such that the laser beam reaches the repair unit through the substrate.

A thickness of the repair unit may be smaller than a thickness of the contact unit.

The first insulating layer, the second insulating layer, and the third insulating layer may be sequentially disposed over the repair unit, and the top electrode is disposed over the third insulating layer.

Still another aspect of the present invention provides a method of manufacturing an OLED display, the method including: forming a first activation layer, a second activation layer, and a repair unit over a substrate, wherein the first activation layer and the repair unit are integrated; forming a first gate electrode and a second gate electrode over a first insulating layer that is formed over the first activation layer, the second activation layer and the repair unit; forming a bottom electrode connected to the repair unit over a second insulating layer and a flattening layer that are sequentially formed over the first gate electrode and the second gate electrode; forming an opening in a third insulating layer formed over the flattening layer to expose the bottom electrode; forming an intermediate layer and a top electrode over the exposed bottom electrode to form a pixel; determining whether the pixel has a white spot defect; and when determined that the pixel has a white spot defect, applying a laser beam to the repair unit of the pixel having the white spot defect.

The first activation layer, the second activation layer, and the repair unit may include a polysilicon.

The applying of the laser beam may cause cutting the repair unit to change the pixel to a dark spot.

The applying of the laser beam may include emitting the laser beam toward the substrate such that the laser beam reaches the repair unit through the substrate.

The first insulating layer, the second insulating layer, the flattening layer, and the third insulating layer may be sequentially disposed over the repair unit, and the top electrode is disposed over the third insulating layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EMBODIMENTS

Figure 1:
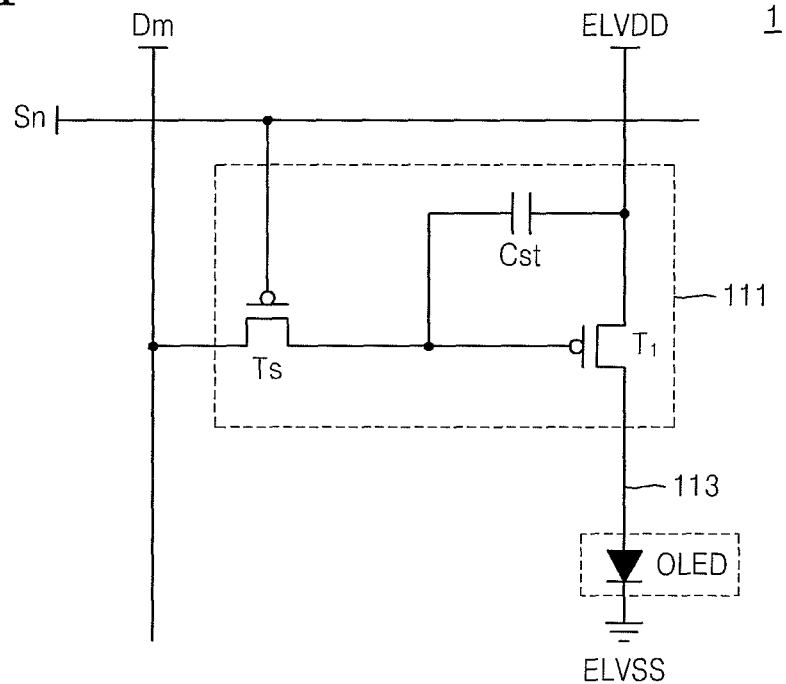
FIG. 1 is a circuit diagram of a pixel included in an organic light emitting device (OLED) display according to an embodiment of the present invention.

In the specification, descriptions or drawings of portions irrelative to the present invention will be omitted, or may be briefly described or drawn. Also, in the drawings, the thicknesses and areas of layers and regions are enlarged or exaggerated for clarity.

Like reference numerals refer to like elements throughout. It will be understood that, although the terms first, second, etc. may be used herein to distinguish one element from another element, not to be limited by the terms. It will also be understood that when a layer, a region, an element is referred to as being "on" or "above" another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present.

Reference will now be made in detail to embodiments, examples of which are illustrated in the accompanying drawings.

Figure 2:
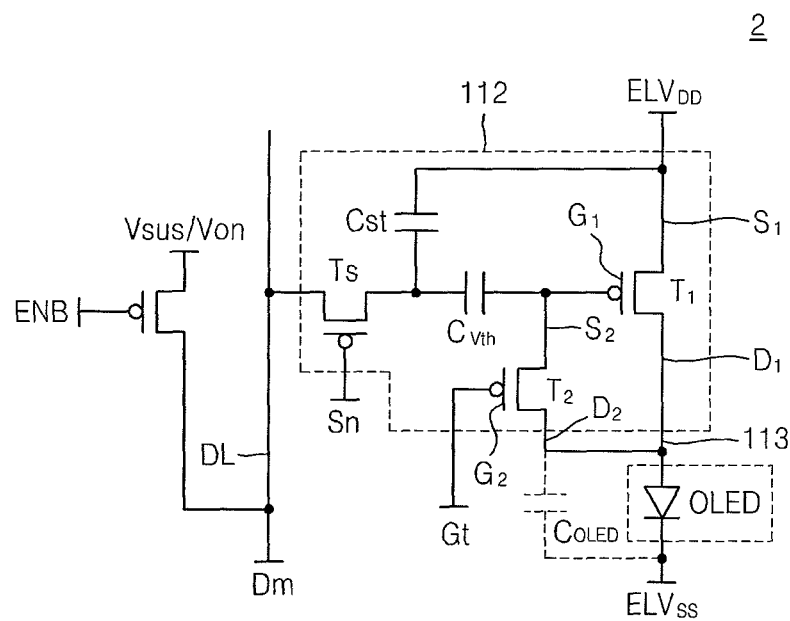
FIG. 2 is a circuit diagram of a pixel included in an OLED display according to another embodiment of the present invention.

FIG. 1 is a circuit diagram of a pixel 1 included in an organic light emitting device display according to an embodiment of the present invention. FIG. 2 is a circuit diagram of a pixel 2 included in an organic light emitting device (OLED) according to another embodiment of the present invention.

An OLED display is divided into a display region on which an image is displayed and a peripheral region surrounding the display region. In the display region, a plurality of interconnections and a plurality of pixels 1 and 2 are disposed. Each of the pixels 1 or 2 emits a light of red, green, or blue. However, the present invention is not limited thereto. Besides the above described light, a light of violet, orange, or white may also be emitted. In this case, a separate organic light emitting layer is formed for each pixel 1 or 2.

However, the present invention is not limited thereto, and the organic light emitting layer may be commonly formed on the entire pixel 1 or 2. For example, a plurality of organic light emitting layers emitting red, green, and blue lights may be vertically laminated or mixed to emit a white light. This combination of colors for emitting a white light is not limited thereto. Meanwhile, in this case, a color converting layer or a color filter for converting the emitted white light into a predetermined color light may be separately included.

A single pixel 1 or 2 is connected to a plurality of interconnections and driven by receiving various signals and voltages through the interconnections. The pixel 1 or 2 is connected to the interconnections and includes a pixel circuit unit 111 or 112 including various electronic elements and an OLED connected to the pixel circuit unit 111 or 112.

The pixel circuit unit 111 or 112 includes at least two thin film transistors (TFTs) and at least one capacitor.

For example, referring to FIG. 1, the pixel circuit unit 111 includes a switching TFT Ts, the gate terminal thereof receiving a scan signal Sn, and the source terminal thereof receiving a data signal Dm. The drain terminal of the switching TFT Ts is connected to the gate terminal of a driving TFT T1. The source terminal of the driving TFT T1 receives a supply voltage $ELV_{DD}$, and the drain terminal is connected to the OLED. Also, a storage capacitor Cst is connected between the drain terminal of the switching TFT Ts and the source terminal of the driving TFT T1.

In the pixel circuit 111 including these two transistors and one capacitor, the switching TFT Ts is turned on by the scan signal Sn to charge a voltage corresponding to a data signal Dm to the storage capacitor Cst, and the driving TFT T1 transfers a current corresponding to the charged voltage to the OLED.

However, the embodiment of the present invention is not limited thereto. The pixel circuit unit 112 may include three or more transistors and two or more capacitors.

For example, referring to FIG. 2, the pixel circuit unit 112 further includes a common control TFT T2 as well as the switching TFT Ts and the driving TFT T1. Also, the pixel circuit 112 may further include a compensation capacitor $C_{Vth}$ as well as the storage capacitor Cst.

A common control signal Gt is applied to the gate terminal of the common control TFT T2, the source terminal of the common TFT T2 is connected to the gate terminal of the driving TFT T1, and the drain terminal of the common control TFT T2 is connected to the drain terminal of the driving TFT T1. In the driving TFT T1, a threshold voltage may change over time. The common control TFT T2 is connected to the driving TFT T1 as a diode according to the common control signal Gt and compensates for the threshold voltage of the driving TFT T1. The compensation capacitor $C_{Vth}$ is connected between the switching TFT Ts and the driving TFT T1.

As can be seen from the pixels 1 and 2 shown in FIGS. 1 and 2, the pixel circuit unit 111 or 112 and the OLED are electrically connected to each other. However, in the manufacturing process of the pixel 1 or 2, an overcurrent may flow into a specific pixel 1 or 2 and a white spot may occur in the corresponding pixel 1 or 2 due to, for example, a pattern defect in a specific area, unexpected changes in film characteristics, or adverse effects of a foreign material. An OLED display having one or more white spots is not possibly treated as a non-defective unit. However, if the entire OLED display having one or more white spots is discarded, high production yield loss and great economic loss may occur. Therefore, a repair process for converting a white spot into a dark spot is required. The repairing process of the dark spot may be performed by cutting a connection portion between the pixel circuit unit 111 or 112 and the OLED.

According to an embodiment of the present invention, the repair process may be easily performed by disposing a repair unit or cutting-off portion 113 between the pixel circuit unit 111 or 112 and the OLED. Hereinafter, the repair process will be described in detail with reference to FIGS. 3 and 4.

Figure 3:
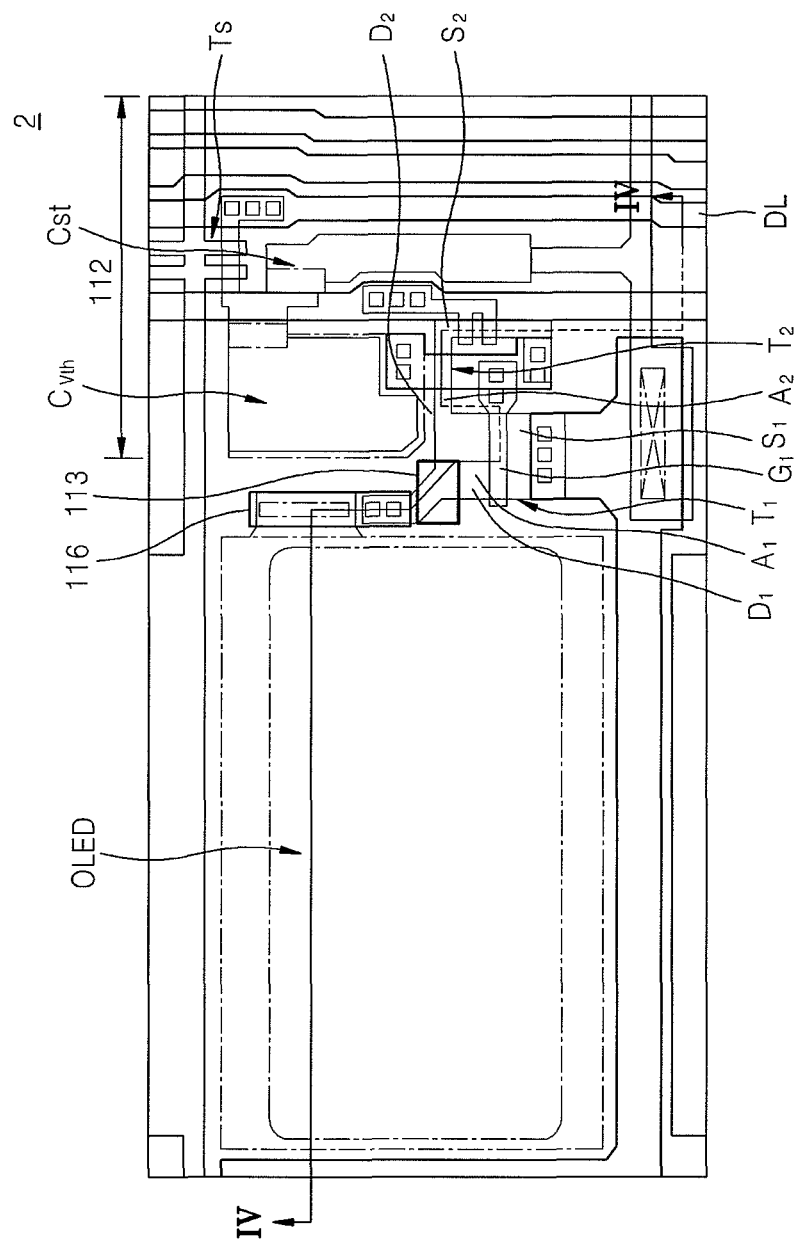
FIG. 3 is a schematic plan view of the pixel in FIG. 2.
Figure 4:
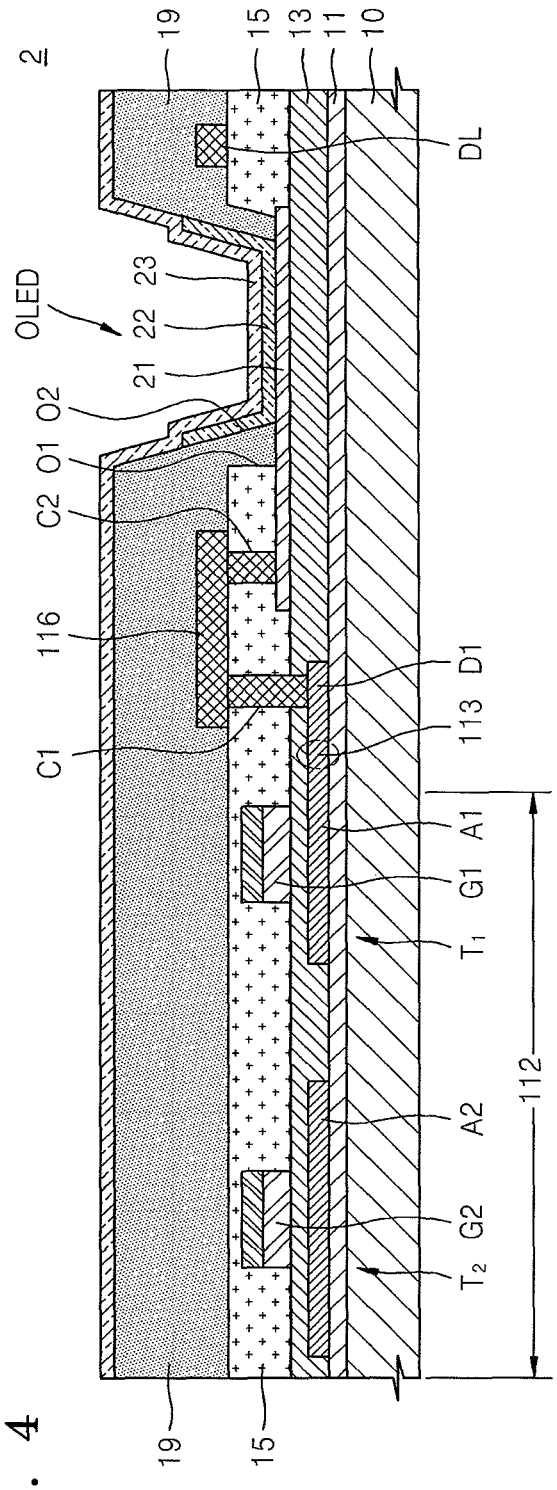
FIG. 4 is a cross-sectional view cut along a line IV-IV in the plan view of FIG. 3.
Figure 5:
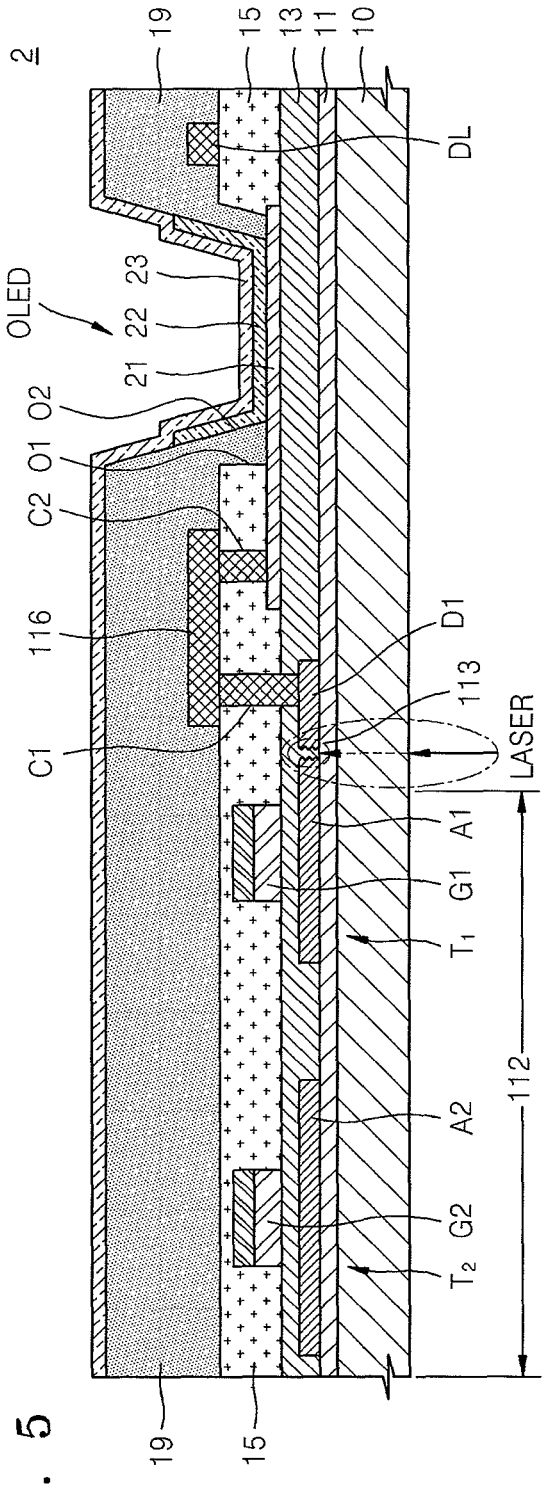
FIG. 5 illustrates laser repair that is performed on the pixel shown in FIG. 4.

FIG. 3 is a schematic plan view of the pixel 2 shown in FIG. 2. FIG. 4 is a cross-sectional view cut along a line IV-IV in the plan view of FIG. 3. Hereinafter, a manufacturing process of an OLED including a repair unit 113 will be sequentially described in detail with reference to FIGS. 3 and 4. FIG. 5 illustrates laser repair that is performed on the pixel 2 shown in FIG. 4. Accordingly a repair process performed by using the repair unit 113 will be described with further reference to FIG. 5.

First, a substrate 10 is prepared. The substrate 10 may be formed of a transparent glass or a transparent plastic. The substrate 10 may also be a bendable or foldable transparent plastic film, or a transparent thin film glass. The substrate 10 is required to be a transparent material, because the repair is performed by emitting a laser beam toward the substrate 10 such that the laser beam reaches the repair portion 113 through the substrate 10.

A buffer layer 11 may be formed on the substrate 10 by using a dielectric material so that foreign materials are prevented from getting through to flatten the surface thereof. The buffer layer 11 is not an essential element.

Hereinafter, the driving TFT T1, the common control TFT T2 and the OLED will be mainly described. The reason for this is that, as disclosed in FIG. 2, the driving TFT T1, the common control TFT T2 and the OLED are generally associated with the repair unit 113. The driving TFT T1 and the common control TFT T2 respectively include an activation layer A1 or A2, and a gate electrode G1 or G2. A source region S1 or S2 of the activation layer A1 or A2 plays a role of a source electrode, and a drain region D1 or D2 of the activation layer A1 or A2 plays a role of a drain electrode. That is, the driving TFT T1 and the common TFT T2 are not a top gate type or a bottom gate type, and have a structure allowing the source and drain electrodes to be the same layer as the activation layer A1 or A2.

A semiconductor layer is formed on the buffer layer 11 to correspond to a position of each TFT T1 or T2. The semiconductor layer includes the activation layer A1 or A2 forming the TFT A1 or A2, and the repair unit 113. The activation layer A1 or A2 and the repair unit 113 are connected to each other and are integrated. The activation layer A1 or A2 and the repair unit 113 may be formed of an oxide semiconductor material such as an amorphous silicon, a polysilicon, or a G-I-Z-O [(In2O3)a(Ga2O3)b(ZnO)c], wherein a, b, and c are respectively a real number satisfying conditions a≥0, b≥0, and c>0. The activation layer A1 or A2 and the repair unit 113 may be formed of the same material, for example, a polysilicon formed by annealing amorphous silicon. In this case, both ends of a driving activation layer A1 included in the driving TFT T1 and a common control activation layer A2 included in the common control TFT T2 are doped to be a driving source region S1, a light emitting control source region S2, a driving drain region D1, or a light emitting control drain region D2. In embodiments, the repair unit 113 may be doped when the activation layers A1 and A2 are doped.

The activation layer A1 or A2 and the repair unit 113 may have a thickness of several hundred Å. The activation layer A1 or A2 and the repair unit 113 may have a thickness of about 400 Å to about 500 Å. With this minimum thickness, the repair unit 113 may easily cut by way of the application of a laser beam.

Meanwhile, as shown in FIG. 3, the repair unit 113 has a width smaller than that of the activation layer A1 or A2. With this minimum width, the repair unit 113 may easily cut by way of the application of a laser beam.

In embodiments, the repair unit 113 is formed of the same semiconductor material with the activation layer A1 or A2, because the repair unit 113 is formed simultaneously with the activation layer A1 or A2. Accordingly, even though a residual layer or portion remains when the repair unit 113 is cut by a laser beam, a problem of a short-circuit defect occurrence due to the residual layer can be prevented because the residual layer is not a conductor. In one embodiment, the repair unit 113 and the activation layer A1 may be integrally formed as a first portion of the semiconductor layer, and the activation layer A2 may be formed as a second portion of the semiconductor layer. In another embodiment, the repair unit 113 and the activation layer A2 may be integrally formed as a first portion of the semiconductor layer and the activation layer A1 may be formed as a second portion of the semiconductor layer. In a further embodiment, the repair unit 113 and the activation layer A2 may be integrally formed as a single portion of the semiconductor layer. In an alternative embodiment, the repair unit 113 may be formed as a first portion of the semiconductor layer, which is separate a second portion of the semiconductor layer forming the activation layer A1 or A2. In embodiments, the first and second portions of the semiconductor layer may be electrically connected to each other.

Then, a gate insulating layer 13 is formed on the entire substrate 10 so as to cover the semiconductor layer. The gate insulating layer 13 may be formed of a single layer or a plurality of layers of an organic material or an inorganic material, for example, silicon oxide (SiOx) or silicon nitride (SiNx).

Then, a driving gate electrode G1 is formed on the gate insulating layer 13 in order to correspond to the driving activation layer A1, and a common control gate electrode G2 is formed on the gate insulating layer 13 in order to correspond to the common control activation layer A2. A bottom electrode pattern (not shown) including a bottom electrode 21 is formed on the gate insulating layer 13 corresponding to a position of the OLED simultaneously with the formation of the gate electrodes G1 and G2. The gate electrodes G1 and G2, and the bottom electrode pattern (not shown) have a structure in which transparent conductive oxide material layers and low resistive metal layers are laminated. For example, the transparent conductive oxide material layer may include Indium Tin Oxide (ITO), and the low resistive metal layer may include a plurality of layers of molybdenum (Mo) and aluminium (Al). The gate electrodes G1 and G2 and the bottom electrode pattern (not shown) may have a thickness of several thousand Å.

The structures shown in FIGS. 3 and 4 simplify a mask process, in which the gate electrodes G1 and G2 and the bottom electrode pattern are simultaneously formed. Accordingly, it is effective to simplify a mask process or a lithography process adopted in patterning of each layer in manufacturing an OLED display.

Then an inter-layer insulating layer 15 is formed to cover the gate electrodes G1 and G2, and the bottom electrode pattern. The inter-layer insulating layer 15 may be formed of a single layer or a plurality of layers of an organic material or an inorganic material, for example, silicon oxide or silicon nitride. A preparation process is performed to form a contact unit 116 in the insulating layers 13 and 15. For example, a first contact hole C1 is formed in the gate insulating layer 12 and the inter-layer insulating layer 15 in order to expose a portion of the repair unit 113. A second contact hole C2 is formed in the inter-layer insulating layer 15 in order to expose a portion of the bottom electrode pattern. At the same time, a first opening unit O1 is also formed in the inter-layer insulating layer 15 in order to expose at least an edge of the bottom electrode pattern.

Then, the contact unit 116 is formed on the inter-layer insulating layer 15. The contact unit 116 directly and electrically connects the repair unit 113 to the bottom electrode 21. One end of the contact unit 116 is connected to the repair unit 113 through the first contact hole C1, and another end thereof is connected to the bottom electrode pattern through the second contact hole C2. The contact unit 116 may be formed on the same layer as the interconnections, for example, data lines DL. Accordingly, the contact unit 116 may be formed of a low resistive material including a plurality of layers of Mo or Al in order to reduce an interconnection resistance. In addition, the data lines DL may be formed to be several thousand Å thick in order to reduce the interconnection resistance. Since the contact unit 116 is simultaneously formed with the data lines DL, the contact unit 116 may have a thickness of several thousand Å.

The contact units 116 shown in FIGS. 3 and 4 are only an embodiment, and the present invention is not limited thereto. That is, the contact unit 116 may be formed on various layers besides the same layer as the data lines DL. For example, the contact unit 116 may be formed on the same layer as the gate electrode. The contact unit 116 may be formed on any layer as long as the contact unit 116 has a structure of electrically connecting the repair unit 113 and the bottom electrode 21.

Simultaneously with the forming of the contact unit 116, the bottom electrode 21 is formed by removing the low resistive metal layer, which forms the bottom electrode pattern, and is exposed through the first opening O1. That is, only the transparent conductive oxide material layer is left among the layers of the bottom electrode pattern. Accordingly, the bottom electrode 21 may be formed of the transparent conductive oxide material. If an OLED display is a bottom emission type which emits a light in a direction of the substrate 10, the bottom electrode 21 is formed of a transparent electrode. However, if the OLED display is a top emission type which emits a light in a reverse direction of the substrate 10, the bottom electrode 21 is formed of a reflective electrode and may further include a layer of a reflective metal such as silver (Ag) besides the transparent conductive oxide material layer.

Then, a pixel defined layer 19 is entirely formed on the inter-layer insulating layer 15 so as to cover the contact unit 116. The pixel defined layer 19 may be formed of a single layer or a plurality of layers of an organic material or an inorganic material, for example, polyimide. A second opening unit O2 is also formed to expose at least an edge of the bottom electrode 21.

An intermediate layer 22 including an organic light emitting layer is formed on the exposed bottom electrode 21.

A top electrode 23 is entirely formed on the pixel defined layer 19 so as to cover the intermediate layer 22. If an OLED display is a bottom emission type which emits a light in a direction of the substrate 10, the top electrode 23 may be formed of a reflective electrode having a large thickness and formed of a metal material. However, if the OLED display is a top emission type which emits a light in a reverse direction of the substrate 10, the top electrode 23 may be formed of a transparent electrode by depositing a metal material thinly or may be formed of a transparent conductive oxide material.

The pixel 2 is formed by the above described process, and this process is described schematically and may further include supplementary processes.

Then, it is determined whether the pixel 2 has a white spot defect. The white spot defect may occur in a manufacturing process of the pixel 2 shown in FIGS. 1 and 2 as described above, and it is determined whether this white spot defect exists by using the following method. For example, a current flowing through the pixel 2 is measured by using an electron beam, and the existence of the white spot may be determined when an overcurrent is detected in the measured current.

If the pixel 2 having the white spot defect is identified, a repair process is performed as shown in FIG. 5. In detail, a repair process of changing a white spot to a dark spot is performed. In the repair process, the repair unit 113 is cut by applying a laser beam to the repair unit 113, an electrical connection between the pixel circuit 112 and the OLED is cut, and then the corresponding pixel 2 is changed to the dark spot. As shown in FIG. 5, a laser beam is emitted toward the substrate 10. For the laser beam, various types of laser beam may be used, for example, an yttrium aluminium garnet (YAG) laser beam having about a several thousand nm wavelength.

According to an embodiment of the present invention, the repair unit 113 is formed closer to the substrate 10, compared to a layer on which gate electrodes G1 and G2 are formed and a layer on which data lines DL are formed. The repair unit 113 formed on the same layer as the activation layers A1 and A2 is a pattern disposed closest to the substrate 10. Thus, by forming the repair unit 113 closer to the substrate 10 than another conductive material layer, a pattern of such conductive material layer is prevented from being damaged during the repair process.

Meanwhile, the gate insulating layer 12, the inter-layer insulating layer 15 and the pixel defined layer 19 are sequentially formed on the repair unit 113, and the top electrode 23 is formed on the pixel defined layer 19. Namely, a thick insulating layer is interposed between the repair unit 113 and the top electrode 23. Accordingly, during emission of a laser beam to the repair unit 113, a probability of the top electrode 23 being damaged is remarkably lowered.

Figure 6:
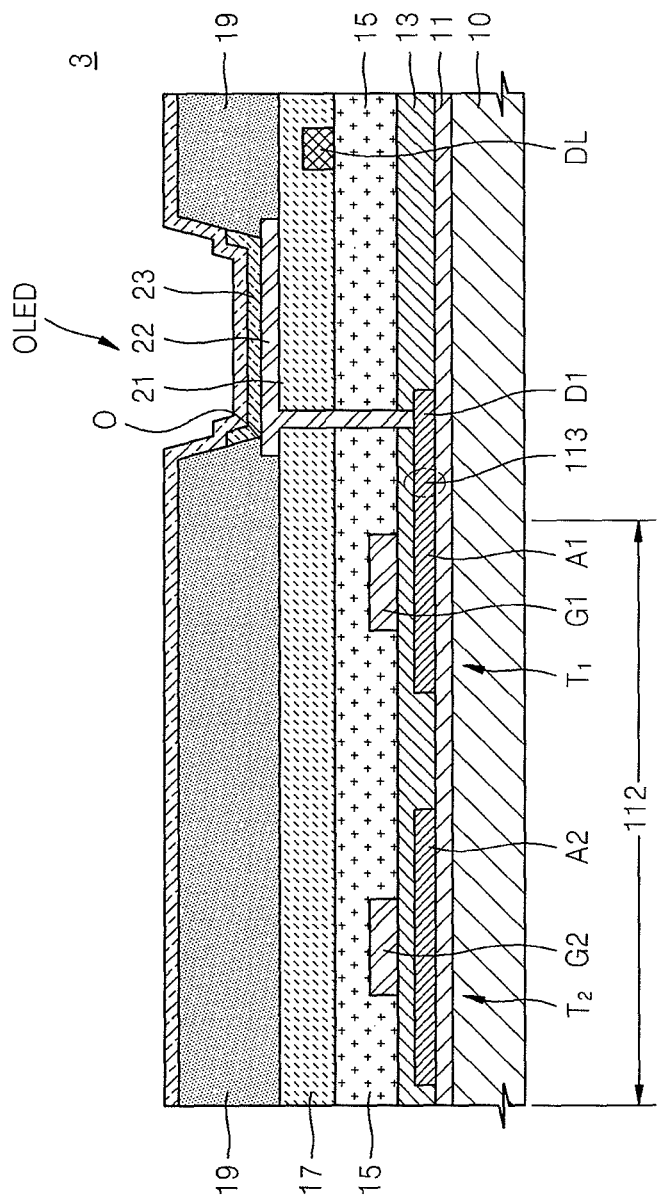
FIG. 6 is a cross-sectional view illustrating another embodiment of the pixel shown in FIG. 4.
Figure 7:
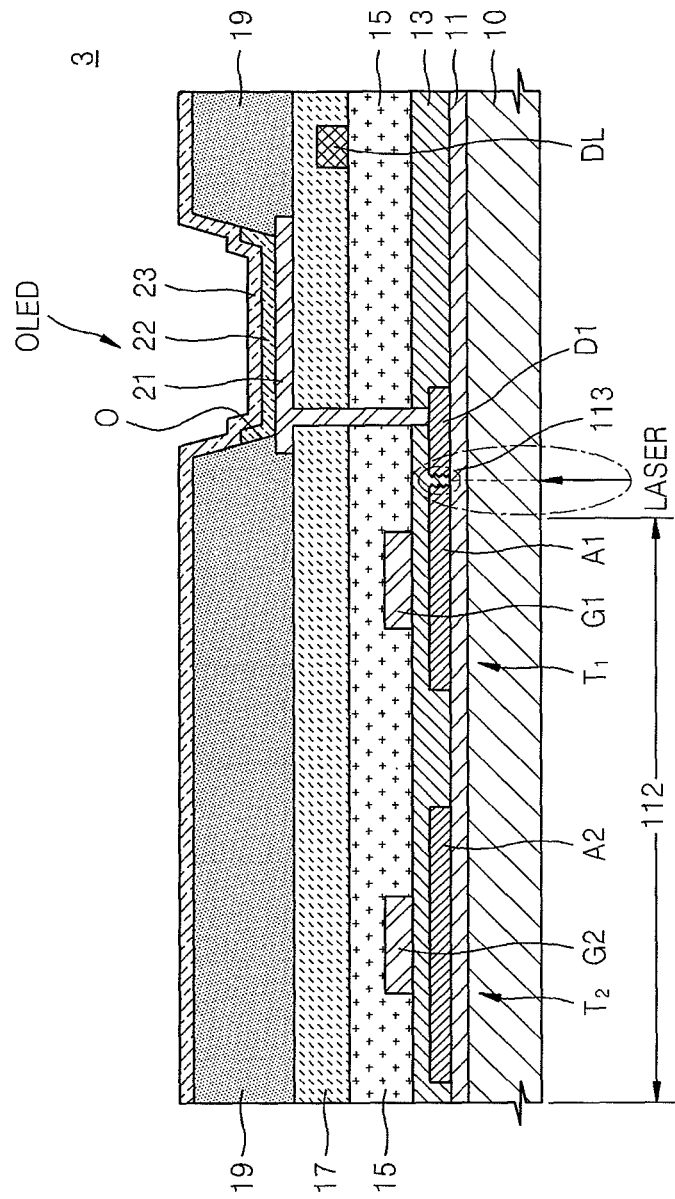
FIG. 7 illustrates laser repair that is performed on the pixel shown in FIG. 6.

A pixel 3 in FIG. 6 is a cross-sectional view illustrating another embodiment of the pixel 2 in FIG. 4. FIG. 7 illustrates laser repair that is performed on the pixel 3 in FIG. 6. An embodiment illustrated in FIG. 6 is of an OLED display to which a mask reducing structure is not applied, which is different from the embodiment illustrated in FIG. 4. Hereinafter, portions that are different from those described regarding FIG. 4 will be described.

First, a substrate 10 is prepared and a buffer layer 11 is formed on the substrate 10.

A semiconductor layer is formed to correspond to positions of TFT transistors T1 and T2 on the buffer layer 11. The semiconductor layer includes activation layers A1 and A2 forming the TFT transistors T1 and T2, and a repair unit 113. The activation layers A1 and A2, and the repair unit 113 are connected to each other and integrated. The activation layers A1 and A2, and the repair unit 113 may be formed of a polysilicon formed by annealing amorphous silicon. Descriptions regarding the activation layers A1 and A2, and the repair unit 113 are the same as those regarding FIG. 4. Therefore, repetitive descriptions will be omitted.

A gate insulating layer 13 is formed on the entire substrate 10 so as to cover the semiconductor layer.

A driving gate electrode G1 is formed to correspond to a driving activation layer A1 on the gate insulating layer 13, and a common control gate electrode G2 is formed to correspond to a common control activation layer A2. Meanwhile, in FIG. 6, the mask reducing structure is not used. Therefore, a gate electrode and a bottom electrode pattern are not formed together, which is different from FIG. 4. Also, gate electrodes G1 and G2 have a structure of a low resistive metal layer.

Then, an inter-layer insulating layer 15 and a flattening layer 17 are formed to cover the gate electrodes G1 and G2. The flattening layer 17 may be formed of a single layer or a plurality of layers of an organic or an inorganic material, for example, silicon oxide or silicon nitride. Although not shown in the drawings, interconnections such as data lines DL are formed between the inter-layer insulating layer 15 and the flattening layer 17. Although not shown in the drawings, the data lines DL may be connected to a switching TFT transistor Ts through a contact structure.

A first contact hole C1 is formed to expose a portion of a repair unit 113 in the gate insulating layer 12, the inter-layer insulating layer 15, and the flattening layer 17.

A bottom electrode 21 is formed on the flattening layer 17 corresponding to a position of an OLED. The bottom electrode 21 is formed to be connected to the repair unit 113 through the first contact hole C1. Meanwhile, the present invention is not limited to those shown in FIG. 6. For example, a contact unit may be further formed between the repair unit 113 and the bottom electrode 21. At this time, the contact unit may be formed on the same layer as the data lines DL. The contact unit may be formed of a low resistive material including a plurality of layers of Mo and Al. Meanwhile, the contact unit may be formed on various layers other than the same layer as the data lines DL. The contact unit may be formed on any layer as long as the contact unit has a structure whereby the repair unit 113 and the bottom electrode 21 are electrically connected.

Then, a pixel defined layer 19 is entirely formed on the flattening layer 17 so as to cover the bottom electrode 21. A second opening O2 is formed to expose at least an edge of the bottom electrode 21.

Then, an intermediate layer 22 including an organic light emitting layer is formed on the exposed bottom electrode 21.

And a top electrode 23 is entirely formed on the pixel defined layer 19 so as to cover the intermediate layer 22.

According to the above described process, a pixel 3 is formed. Since this process is schematically described, supplemental processes may be further included.

Then, it is determined whether the pixel 3 has a white spot defect. If the pixel 3 in which the white spot defect occurs is designated, repair is performed as shown in FIG. 7. In detail, a repair process of changing a white spot to a dark spot is performed. In the repair process, the repair unit 113 is cut by applying a laser beam to the repair unit 113, an electrical connection between the pixel circuit 112 and the OLED is cut, and then the corresponding pixel 3 is changed to the dark spot. As shown in FIG. 7, a laser beam is emitted toward the substrate 10. As the laser beam, various types of a laser may be used, for example, an yttrium aluminium garnet (YAG) laser beam having about a several thousand nm wavelength.

According to embodiments of the present invention as shown in FIGS. 6 and 7, the gate insulating layer 13, the inter-layer insulating layer 15, the flattening layer 17, and the pixel defined layer 19 are sequentially formed on the repair unit 113, and the top electrode 23 is formed on the pixel defined layer 19. Namely, a thick insulating layer is interposed between the repair unit 113 and the top electrode 23. Accordingly, during emission of a laser beam to the repair unit 113, a probability of the top electrode 23 being damaged is remarkably lowered.

Figure 8:
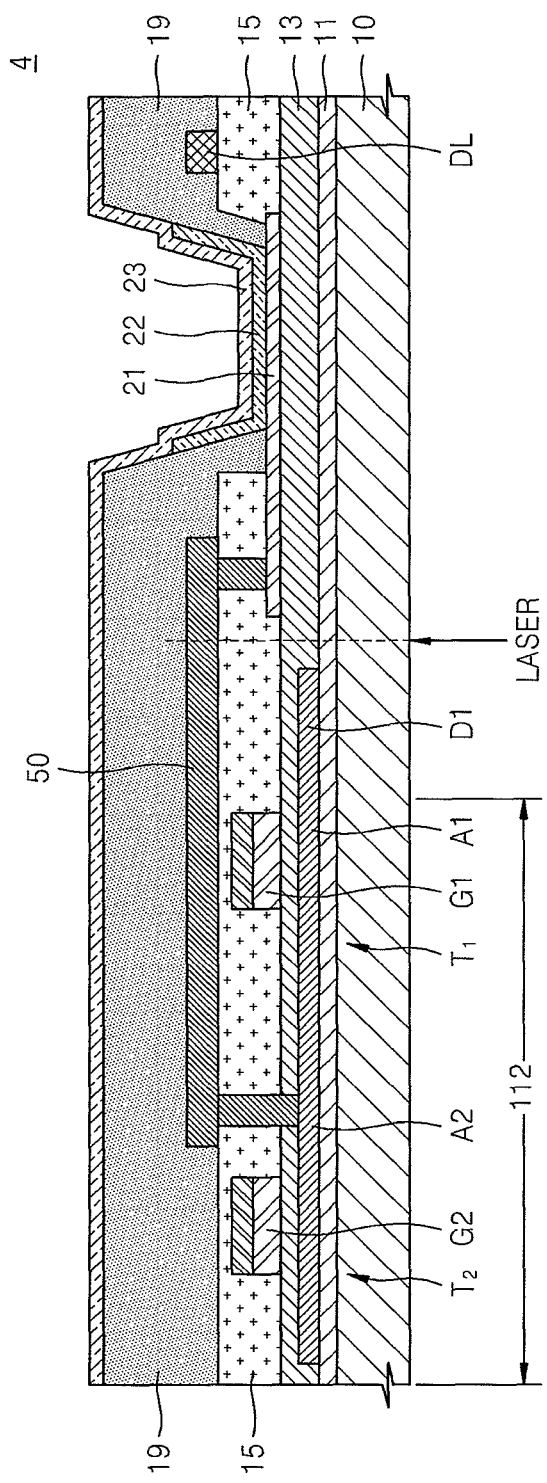
FIG. 8 is a cross-sectional view illustrating a comparative example of the present invention.

FIG. 8 is a cross-sectional view illustrating a comparative example of the present invention.

Referring to FIG. 8, a pixel circuit 112 and an OLED are connected to a low resistive metal layer on the same layer as data lines DL. If repair is performed on a white spot defect pixel, a laser beam is emitted to the low resistive metal layer and is thus cut. However, the low resistive metal layer in the data lines DL is thickly formed in order to reduce line resistance. Accordingly, the low resistive metal layer on the same layer as the data lines DL has a thickness of several thousand Å, for example, about 4000 Å to about 6000 Å.

In the comparative example in FIG. 8, the low resistive metal layer is too thick to be completely cut by a laser beam, and when a conductive material of the low resistive metal layer remains as a residual layer, a short-circuit defect may occur. However, the repair unit 113 according to embodiments of the present invention is simultaneously formed with the activation layers A1 and A2 to have a thickness of several hundred Å, which is thinner than the low resistive metal layer in FIG. 8. Therefore, it is easily cut. Since the repair unit 113 according to embodiments of the present invention is also formed of a semiconductor material, a short-circuit defect does not occur despite the remaining residual layer.

In the comparative example in FIG. 8, only the pixel defined layer 19 is interposed between the low resistive metal layer and the top electrode 23. Accordingly, it is highly possible for the top electrode 23 to be damaged during emission of a laser beam. However, in the embodiments of the present invention, at least the inter-layer insulating layer 15, the flattening layer 17, the pixel defined layer 19, and the like are interposed between the repair unit 113 and the top electrode 23. Therefore, there is little possibility that the top electrode 23 may be damaged during emission of a laser beam.

According to embodiments of the present invention, an OLED is easily repairable by changing a pixel in which a white spot defect is detected to a dark spot by using a repair unit formed of a semiconductor.

While embodiments of the present invention have been particularly shown and described, it will be understood by those of ordinary skill in the art that various changes in form and details may be made therein without departing from the spirit and scope of the present invention as defined by the following claims.

What is claimed is:

1. A method of manufacturing an OLED display, the method comprising:
forming, over a substrate, a first active layer, a second active layer, and a repair unit as an extension of the first active layer;
forming a first insulation layer over the first active layer, the second active layer and the repair unit;
forming a first gate electrode and a second gate electrode over the first insulation layer;
forming a pixel electrode over the first insulation layer;
forming a second insulation layer over the first gate electrode, the second gate electrode and the pixel electrode;

forming a first contact via through the first and second insulation layers to contact the repair unit;
forming a second contact via through the second insulation layer to contact the pixel electrode;
forming a contact line over the second insulation layer to electrically connect the first and second contact vias;
forming a third insulation layer over the contact line, the third insulation layer comprising an opening to expose the pixel electrode;
forming an intermediate layer and a common electrode over the exposed pixel layer to form a pixel;
determining whether the pixel has a white spot defect; and
when determined that the pixel has a white spot defect, applying a laser beam onto the repair unit of the pixel which has the white spot defect.

2. The method according to claim 1, wherein the first active layer, the second active layer and the repair unit comprises a polysilicon.

3. The method according to claim 1, wherein the applying of the laser beam causes cutting the repair unit to change the pixel to a dark spot.

4. The method according to claim 1, wherein the applying of the laser beam comprises emitting the laser beam toward the substrate such that the laser beam reaches the repair unit through the substrate.

5. The method according to claim 1, wherein a thickness of the repair unit is smaller than a thickness of the contact line.

6. The method according to claim 1, wherein the first insulation layer, the second insulation layer, and the third insulation layer are sequentially disposed over the repair unit, and the common electrode is disposed over the third insulation layer.

7. A method of manufacturing an OLED display, the method comprising:
forming, over a substrate, a first active layer, a second active layer, and a repair unit as an extension of the first active layer;
forming a first insulation layer over the first active layer, the second active layer and the repair unit;
forming a first gate electrode and a second gate electrode over the first insulation layer;
forming a pixel electrode over the first insulation layer,
forming a second insulation layer over the first gate electrode, the second gate electrode and the pixel electrode;
forming a first contact via through the first and second insulation layers to contact the repair unit;
forming a second contact via through the second insulation layer to contact the pixel electrode;
forming a contact line over the second insulation layer to electrically connect the first and second contact vias;
forming a flattening layer over the second insulation layer;
forming a third insulation layer over the flattening layer, the third insulation layer comprising an opening to expose the pixel electrode;
forming an intermediate layer and a common electrode over the exposed pixel electrode to form a pixel;
determining whether the pixel has a white spot defect; and
when determined that the pixel has a white spot defect, applying a laser beam to the repair unit of the pixel having the white spot defect.

8. The method according to claim 7, wherein the first active layer, the second active layer, and the repair unit comprise a polysilicon.

9. The method according to claim 7, wherein the applying of the laser beam causes cutting the repair unit to change the pixel to a dark spot.

10. The method according to claim 7, wherein the applying of the laser beam comprises emitting the laser beam toward the substrate such that the laser beam reaches the repair unit through the substrate.

11. The method according to claim 7, wherein the first insulation layer, the second insulation layer, the flattening layer, and the third insulation layer are sequentially disposed over the repair unit, and the common electrode is disposed over the third insulation layer.

* * * * *